United States Patent
Yen et al.

(10) Patent No.: US 8,957,420 B2
(45) Date of Patent: Feb. 17, 2015

(54) THIN FILM TRANSISTOR ARRAY SUBSTRATE AND MANUFACTURING METHOD THEREOF

(75) Inventors: Ze-Yu Yen, Taipei (TW); Ke-Chih Chang, Taipei (TW); Kuo-Yu Huang, Hsinchu County (TW); En-Yung Lin, Taichung (TW)

(73) Assignee: AU Optronics Corporation, Hsinchu (TW)

( * ) Notice: Subject to any disclaimer, the term of this patent is extended or adjusted under 35 U.S.C. 154(b) by 832 days.

(21) Appl. No.: 13/167,746

(22) Filed: Jun. 24, 2011

(65) Prior Publication Data

US 2012/0161136 A1    Jun. 28, 2012

(30) Foreign Application Priority Data

Dec. 27, 2010 (TW) .............................. 99146144 A

(51) Int. Cl.
*H01L 29/41* (2006.01)
*H01L 27/12* (2006.01)
*H01L 29/417* (2006.01)

(52) U.S. Cl.
CPC .......... *H01L 27/124* (2013.01); *H01L 27/1248* (2013.01); *H01L 29/41733* (2013.01)
USPC ..................... 257/59; 438/34; 257/E33.003

(58) Field of Classification Search
CPC ............ H01L 51/0021; H01L 51/0023; H01L 51/048
USPC .......... 257/59, 72, E33.003, E33.004; 438/34
See application file for complete search history.

(56) References Cited

U.S. PATENT DOCUMENTS

| 7,623,194 | B2 | 11/2009 | Lin | |
| 7,687,289 | B2 | 3/2010 | Lin et al. | |
| 2005/0116232 | A1* | 6/2005 | Kim et al. | 257/72 |
| 2007/0120126 | A1* | 5/2007 | Sung et al. | 257/59 |
| 2008/0237594 | A1* | 10/2008 | Lin et al. | 257/57 |
| 2011/0084271 | A1* | 4/2011 | Yamazaki et al. | 257/43 |

FOREIGN PATENT DOCUMENTS

TW        200821721        5/2008

* cited by examiner

*Primary Examiner* — Wael Fahmy
*Assistant Examiner* — Sarah Salerno
(74) *Attorney, Agent, or Firm* — Jianq Chyun IP Office

(57) ABSTRACT

A thin film transistor (TFT) array substrate with few processing steps and simple structure is provided, wherein merely two patterned metal layers are required and a patterned planarization layer is adopted to separate the two patterned metal layers from each other and thereby reduce power loading. In addition, the patterned planarization layer has slots to form height differences so as to separate scan lines from common electrodes to further reduce the power loading.

19 Claims, 14 Drawing Sheets

THIN FILM TRANSISTOR ARRAY SUBSTRATE AND MANUFACTURING METHOD THEREOF

CROSS-REFERENCE TO RELATED APPLICATION

This application claims the priority benefit of Taiwan application serial no. 99146144, filed Dec. 27, 2010. The entirety of the above-mentioned patent application is hereby incorporated by reference herein and made a part of this specification.

BACKGROUND OF THE INVENTION

1. Field of the Invention

The present invention generally relates to active device array substrate and manufacturing method thereof. More particularly, the present invention relates to a thin film transistor (TFT) array substrate and manufacturing method thereof.

2. Description of Related Art

In general, a liquid crystal display panel (LCD panel) is mainly comprised of an active device array substrate, an opposite substrate, and a liquid crystal layer sandwiched between the active device array substrate and the opposite substrate. The active device array substrate has a display region and a non-display region. A plurality of pixel units are arranged on the display region in an array, and each of the pixel units includes a thin film transistor (TFT) and a pixel electrode connected to the TFT. In addition, a plurality of scan lines and a plurality of data lines are disposed in the display region, and the TFT in each of the pixel units is electrically connected to the corresponding scan line and the corresponding data line. By contrast, signal lines, source drivers, and gate drivers are disposed in the non-display region.

When an LCD panel displays images, pixels in each row in the display panel are sequentially turned on through the gate drivers, and data voltages provided by the source drivers are correspondingly received by each row of pixels within the turn-on period. As such, liquid crystal molecules in each row of pixels are arranged properly based on the data voltages received by the pixels.

On the other hand, with the improvement of resolution of LCD panel, the number of the gate drivers and the number of the source drivers in the LCD must be increased. Consequently, it leads to the expansion of non-display region (also referred to as a frame).

In current technology, the number of data lines can be reduced by the various collocations of pixel design and driving method, for example, two rows of pixels sharing a data line. And the resulting extra space can be used to dispose the scan signal transmission line in order to meet the demands of narrow frame. In addition, for the increasing of aperture ratio of pixels, the storage capacitor electrode within the pixel would overlap the scan signal transmission line and the data line. However, the storage capacitor electrode massively overlapping the scan signal transmission line or data line would cause the power load of LCD panel increase. Otherwise, if the overlapping area of storage capacitor electrode with the scan signal transmission line or data line is reduced, the aperture ratio would relatively decrease.

SUMMARY OF THE INVENTION

A thin film transistor array substrate having the advantages of low power loading, high storage capacitor and high aperture ratio at the same time is provided in this present invention.

A manufacturing method with simple process step of the above mentioned thin film transistor array substrate is provided in this present invention.

For the specific description of present invention, a thin film transistor array substrate is proposed. The thin film transistor array substrate comprises a substrate, a plurality of data lines, a plurality of scan signal transmission lines, a plurality of scan lines, a plurality of thin film transistors, a patterned planarization layer, a plurality of common electrodes, a protective layer and a plurality of pixel electrodes. The data lines and the scan signal transmission lines are disposed in parallel to each other on the substrate with one scan signal transmission line disposed between every two adjacent data lines. The scan lines are disposed in parallel to each other on the substrate and intersecting the data lines and the scan signal transmission lines so as to define a plurality of pixel regions on the substrate. The thin film transistors are disposed on the substrate and each of the thin film transistors is electrically connected to the corresponding scan line and the corresponding data line. The patterned planarization layer is configured on the substrate. The patterned planarization layer has a plurality of slots which expose the scan lines and the thin film transistors and extend along the scan lines. The common electrodes are configured on the patterned planarization layer and surrounding the corresponding pixel regions respectively. The protective layer covers the data lines, the scan signal transmission lines, the scan lines, the thin film transistors, the patterned planarization layer and the common electrodes. The protective layer has a plurality of openings for exposing a portion of a drain of each of the thin film transistors. The pixel electrodes are configured on the protective layer and placed in the corresponding pixel regions. The pixel electrodes are electrically connected to the drains through the openings.

In an embodiment of the present invention, the patterned planarization layer further comprises a plurality of recesses which are corresponding to the pixel regions and the pixel electrodes cover the recesses.

In an embodiment of the present invention, each of the scan lines is located in the center of the corresponding slot.

In an embodiment of the present invention, each of the scan signal transmission lines is electrically connected to the corresponding one of the scan lines.

The present invention further proposes a thin film transistor array substrate comprising a substrate, a patterned first metal layer, a gate insulating layer, a patterned semiconductor layer, a patterned planarization layer, a patterned second metal layer, a protective layer and a patterned transparent electrode layer. The patterned first metal layer comprises a plurality of quasi-data lines, a plurality of scan signal transmission lines, a plurality of quasi-scan lines and a plurality of gates. The quasi-data lines and the scan signal transmission lines are disposed in parallel to each other on the substrate with one scan signal transmission line disposed between every two adjacent quasi-data lines. The quasi-scan lines are disposed in parallel to each other on the substrate and the quasi-scan lines, the quasi-data lines and the scan signal transmission lines define a plurality of pixel regions on the substrate. The gates are configured on the substrate and connected to the quasi-scan lines. The gate insulating layer is configured on the substrate and covers the patterned first metal layer. The gate insulating layer has a plurality of first openings and a plurality of second openings. The first openings expose a portion of each of the quasi-scan lines respectively and the second openings expose a portion of each of the quasi-data lines respectively. The patterned semiconductor layer is configured on the gate insulating layer. The patterned semiconductor layer comprises a plurality of channel patterns which are located above the corresponding gate respectively. The patterned planarization layer is configured on the gate insulating layer. And the patterned planarization layer has a plurality of slots exposing the quasi-scan lines, the gates, the channel patterns, the first openings and the second openings. And the slots extend along the quasi-scan lines. The patterned second metal layer comprises a plurality of first connecting patterns, a plurality of second connecting patterns, a plurality of sources, a plurality of drains and a plurality of common electrodes. The first connecting patterns are configured on the gate insulating layer and located in the corresponding slots. The first connecting patterns are connected to the quasi-scan lines respectively through the corresponding first openings to form a plurality of scan lines. The second connecting patterns are configured on the gate insulating layer and located in the corresponding slots. The second connecting patterns are connected to the quasi-data lines respectively through the corresponding second openings to form a plurality of data lines. The sources and the drains are configured on the channel patterns and located in the corresponding slots. Each of the sources and its corresponding drain are located on the opposite sides of the corresponding gate, and each of the sources is electrically connected to the corresponding data line. The common electrodes are configured on the patterned planarization layer and surrounding the corresponding pixel regions respectively. The protective layer covers the gate insulating layer, the patterned second metal layer, the patterned planarization layer and the channel patterns. The protective layer has a plurality of third openings for exposing a portion of each of the drains. The patterned transparent electrode layer is configured on the protective layer. The patterned transparent electrode layer comprises a plurality of pixel electrodes which are located in the corresponding pixel regions. The pixel electrodes are electrically connected to the drains through the third openings.

In an embodiment of the present invention, the patterned planarization layer further comprises a plurality of recesses which are corresponding to the pixel regions. The pixel electrodes cover the recesses.

In an embodiment of the present invention, each of the scan lines is located in the center of the corresponding slot.

In an embodiment of the present invention, each of the scan signal transmission lines is electrically connected to the corresponding one of the scan lines.

In an embodiment of the present invention, the gate insulating layer further comprises a plurality of fourth openings exposing a portion of each of the scan signal transmission lines. The first connecting patterns are connected to the scan signal transmission lines through the corresponding fourth openings so that each of the scan signal transmission lines is electrically connected to the corresponding one of the scan lines.

In an embodiment of the present invention, the patterned first metal layer further comprises a plurality of third connecting patterns. Each of the third connecting patterns is connected between the corresponding scan signal transmission line and the scan line.

The present invention further proposes manufacturing method of a thin film transistor array substrate. First, a substrate is provided. A patterned first metal layer is formed on the substrate and the patterned first metal layer comprises a plurality of quasi-data lines, a plurality of scan signal transmission lines, a plurality of quasi-scan lines and a plurality of gates. The quasi-data lines and the scan signal transmission lines are parallel to each other with one scan signal transmission line is between every two adjacent quasi-data lines. The quasi-scan lines are parallel to each other and the quasi-scan lines, the quasi-data lines and the scan signal transmission lines define a plurality of pixel regions on the substrate. The gates are connected to the quasi-scan lines. Next, a gate insulating layer is formed on the substrate and the gate insulating layer covers the patterned first metal layer. A patterned semiconductor layer is formed on the gate insulating layer. The patterned semiconductor layer comprises a plurality of channel patterns which are located above the corresponding gate respectively. Then, a plurality of first openings and a plurality of second openings are formed within the gate insulating layer. The first openings expose a portion of each of the quasi-scan lines respectively and the second openings expose a portion of each of the quasi-data lines respectively. Afterward, a patterned planarization layer is formed on the gate insulating layer. The patterned planarization layer has a plurality of slots exposing the quasi-scan lines, the gates, the channel patterns, the first openings and the second openings respectively, and extending along the quasi-scan lines. Then, a patterned second metal layer is formed and the patterned second metal layer comprises a plurality of first connecting patterns, a plurality of second connecting patterns, a plurality of sources, a plurality of drains and a plurality of common electrodes. The first connecting patterns are configured on the gate insulating layer and located in the corresponding slots. The first connecting patterns are connected to the quasi-scan lines respectively through the corresponding first openings to form a plurality of scan lines. The second connecting patterns are configured on the gate insulating layer and located in the corresponding slots. The second connecting patterns are connected to the quasi-data lines respectively through the corresponding second openings to form a plurality of data lines. The sources and the drains are configured on the channel patterns and located in the corresponding slots. Each of the sources and its corresponding drain are located on the opposite sides of the corresponding gate, and each of the sources is electrically connected to the corresponding data line. The common electrodes are configured on the patterned planarization layer and surrounding the corresponding pixel regions respectively. Hereafter, a protective layer is formed for covering the gate insulating layer, the patterned second metal layer, the patterned planarization layer and the channel patterns. Then, third openings are formed within the protective layer for exposing a portion of each of the drains. And then, a patterned transparent electrode layer is formed on the protective layer. The patterned transparent electrode layer comprises a plurality of pixel electrodes which are located in the corresponding pixel regions. The pixel electrodes are electrically connected to the drains through the third openings.

In an embodiment of the present invention, the manufacturing method of a thin film transistor array substrate further comprises forming a plurality of recesses on the patterned planarization layer corresponding to the pixel regions. And the pixel electrodes cover the recesses.

In an embodiment of the present invention, the recesses and the slots are formed in one single photolithographic process.

In an embodiment of the present invention, the first openings, the second openings and the channel patterns are formed in one single photolithographic process.

In an embodiment of the present invention, the first openings and the second openings are formed before forming the patterned planarization layer.

In an embodiment of the present invention, the first openings and the second openings are formed after forming the patterned planarization layer.

In an embodiment of the present invention, the manufacturing method of a thin film transistor array substrate further comprises electrically connecting each of the scan signal transmission lines to the corresponding one of the scan lines.

In an embodiment of the present invention, the manufacturing method of a thin film transistor array substrate further comprises forming a plurality of fourth openings within the gate insulating layer for exposing a portion of each of the scan signal transmission lines, so that the first connecting patterns are connected to the scan signal transmission lines through the corresponding fourth openings and each of the scan signal transmission lines is electrically connected to the corresponding one of the scan lines.

In an embodiment of the present invention, the patterned first metal layer further comprises a plurality of third connecting patterns. Each of the third connecting patterns is connected between the corresponding scan signal transmission line and the scan line.

Based on the above, a thin film transistor array substrate is proposed in present invention. The proposed thin film transistor array substrate is with few processing steps and a simple structure, wherein merely two patterned metal layers are required. And a patterned planarization layer is adopted to separate the two patterned metal layers from each other and thereby reduce the power loading. In addition, the patterned planarization layer has slots to form height differences to separate scan lines from common electrodes to further reduce the power loading.

The above and other features of the present invention will be better understood from the following detailed description of the preferred embodiments of the invention that is provided in communication with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
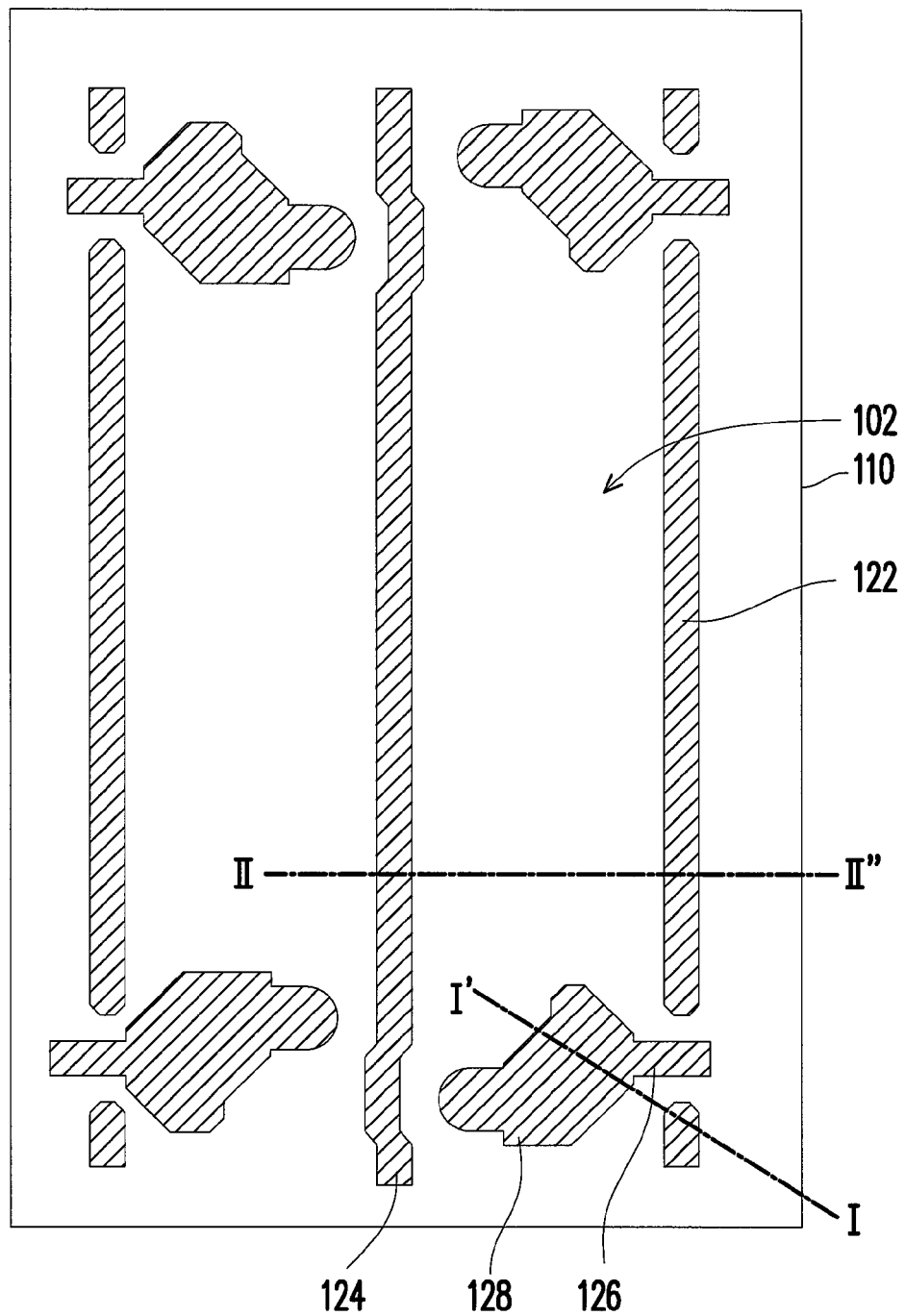
FIGS. 1A-1G sequentially illustrate the process flow of a thin film transistor array substrate according to an embodiment of present invention.
Figure 1A:
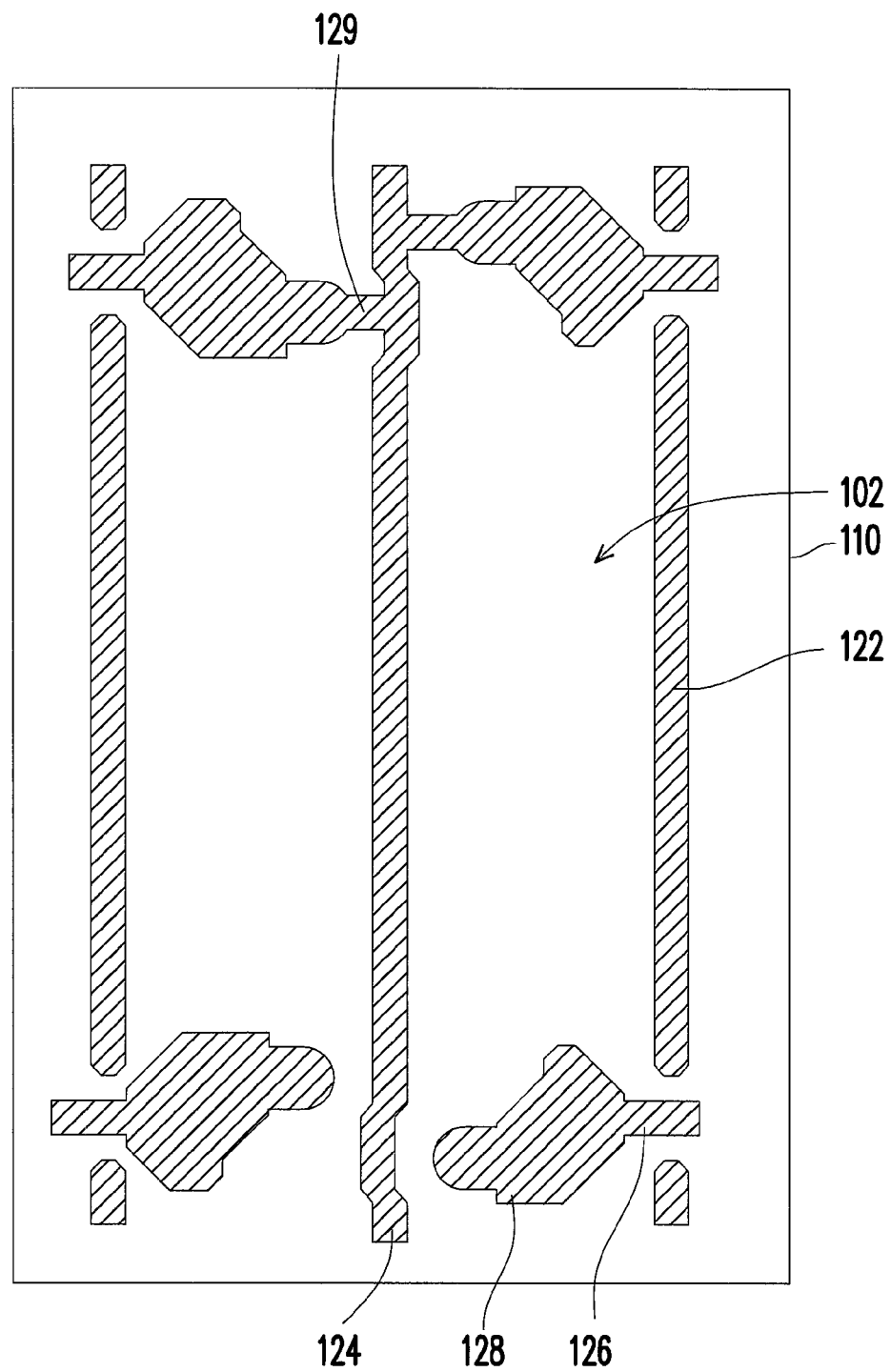

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1G sequentially illustrate the process flow of a thin film transistor array substrate according to an embodiment of present invention. FIGS. 2A-2G are cross section views along the line I-I' and the line II-II' of FIGS. 1A-1G.

Figure 2A:
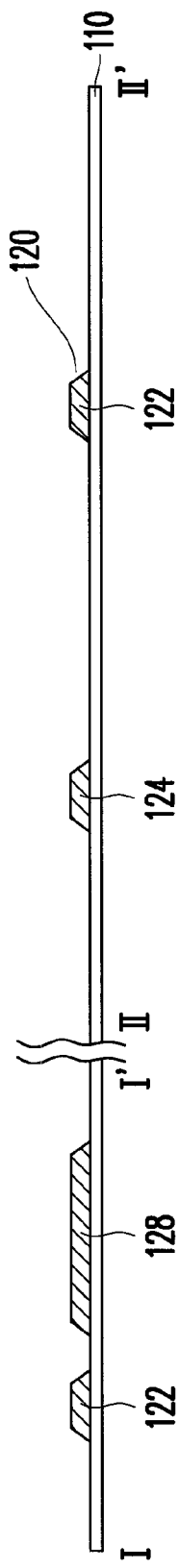
FIGS. 2A-2G are cross section views along the line I-I' and the line II-II' of FIGS. 1A-1G.

First, as shown in FIG. 1A and FIG. 2A, a substrate 110 is provided and a first photolithographic process is done to form a patterned first metal layer 120 on the substrate 110. The patterned first metal layer 120 comprises a plurality of quasi-data lines 122 which are parallel to each other and a plurality of scan signal transmission lines 124 which are parallel to the quasi-data lines 122, wherein one scan signal transmission line 124 is disposed between every two adjacent quasi-data lines 122. In addition, the patterned first metal layer 120 further comprises a plurality of quasi-scan lines 126. And the quasi-data lines 126, the quasi-data lines 122 and the scan signal transmission lines 124 define a plurality of pixel regions 102 on the substrate 110. The patterned first metal layer 120 also comprises a plurality of gates 128 which are connected to the quasi-scan lines 126. The photolithographic process mentioned hereinafter comprises exposure which is done by etching mask (photoresist) with a photo-mask, developing and subsequent etching steps, or comprises exposure done on the photosensitive material layer by a photo-mask and developing steps, etc.

Figure 1B:
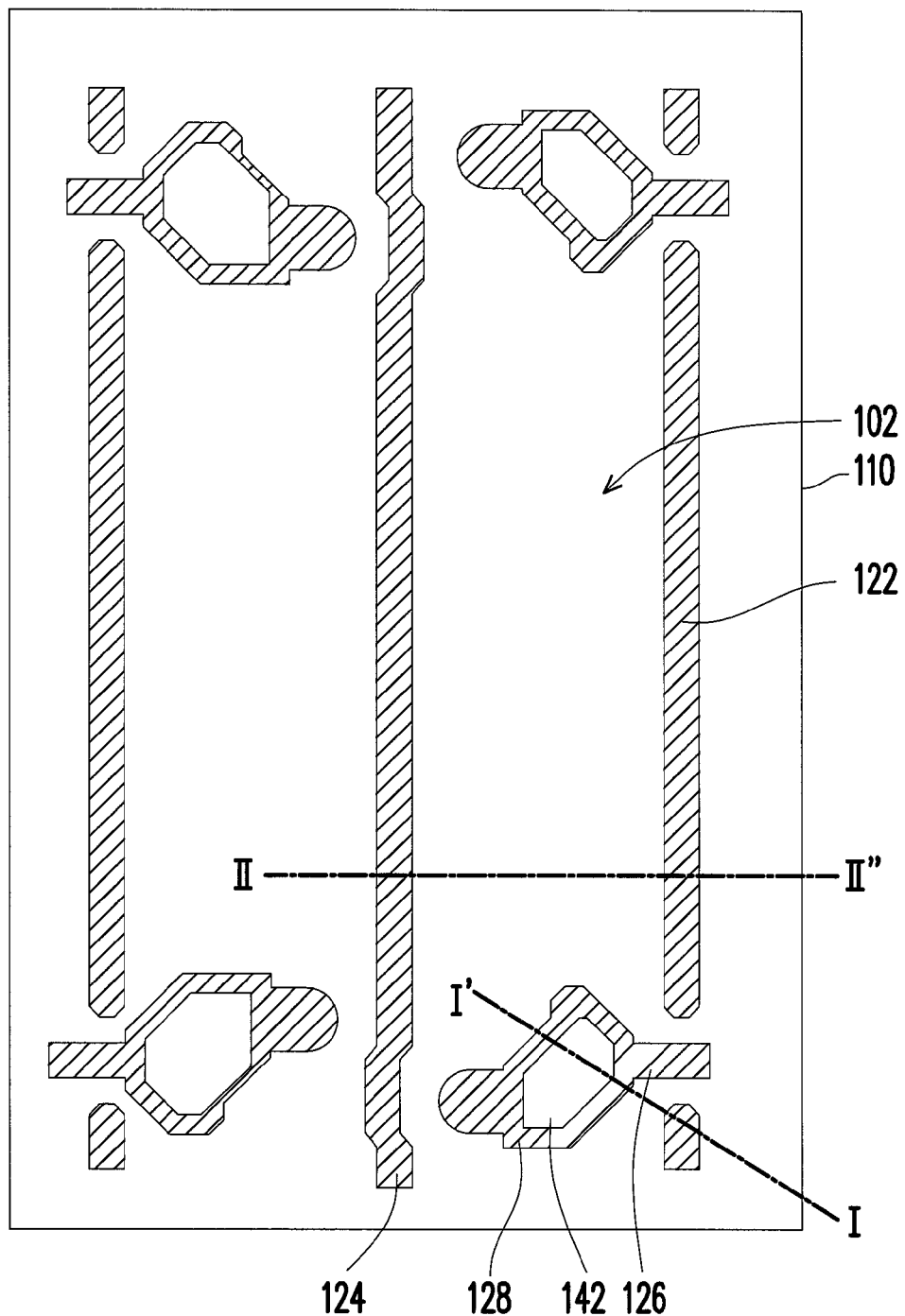
Figure 2B:
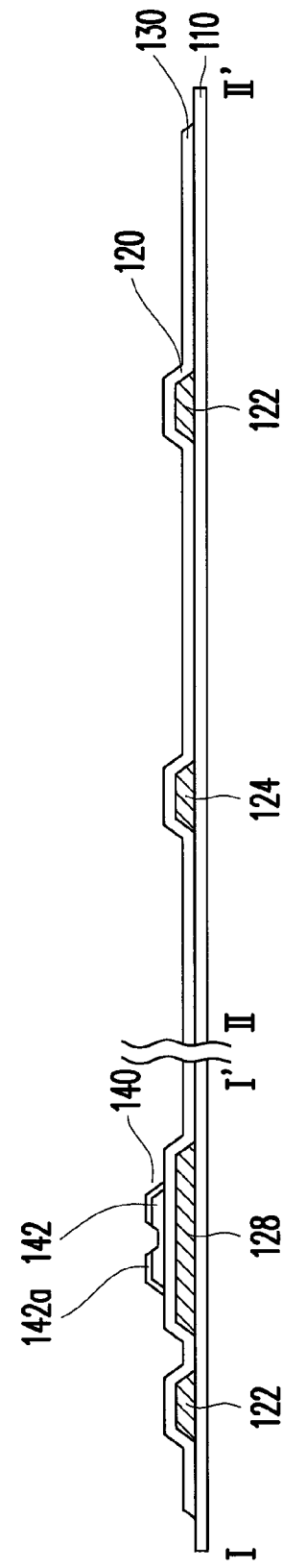

Next, as shown in FIG. 1B and FIG. 2B, a gate insulating layer 130 is formed on the substrate 110 for covering the patterned first metal layer 120. After that, a semiconductor layer is formed and a second photolithographic process is done to form a patterned semiconductor layer 140 on the gate insulating layer 130. The patterned semiconductor layer 140 comprises a plurality of channel patterns 142. Each of the plurality of channel patterns 142 is located above the corresponding gate 128. The surface of channel patterns 142 can have an ohmic contact layer 142a.

Figure 1C:
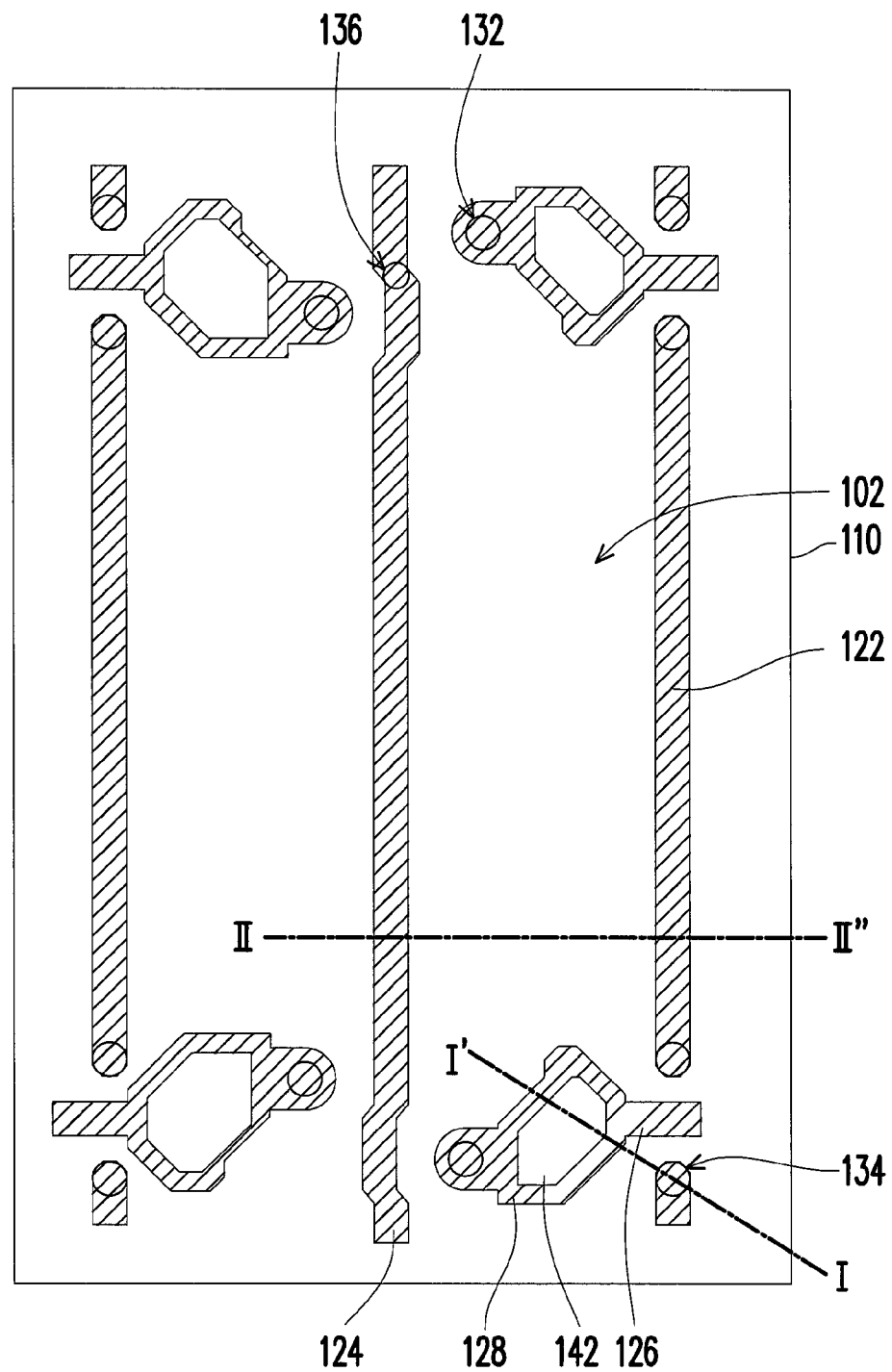
Figure 2C:
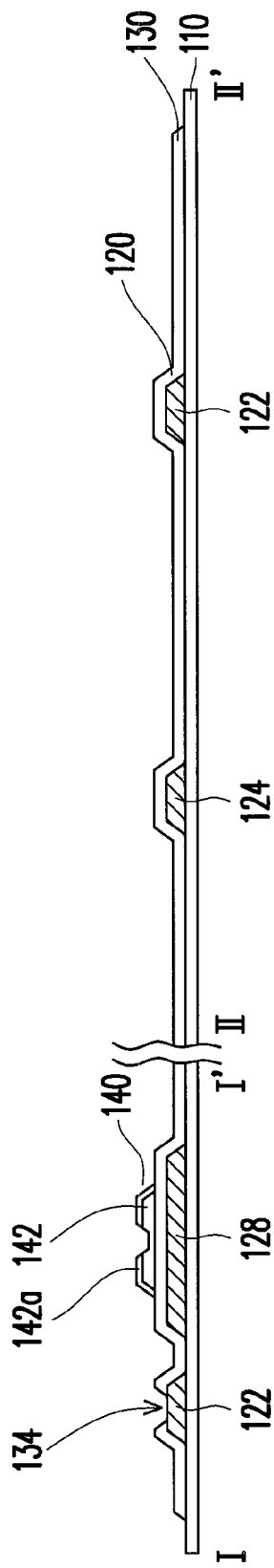

Then, as shown in FIGS. 1C and 2C, a third photolithographic process is done to form a plurality of first openings 132 and a plurality of second openings 134 within the gate insulating layer 130. The first openings 132 expose a portion of each of the quasi-scan lines 126 and the second openings 134 expose a portion of each of the quasi-data lines 122 respectively.

The order of above mentioned second photolithographic process and third photolithographic process is not limited in this embodiment. In other words, it also can be chosen in this embodiment that the first openings 132 and the second openings 134 are formed first within the gate insulating layer 130 and the patterned semiconductor layer 140 is formed next on the gate insulating layer 130.

Moreover, in another embodiment of present invention, the second photolithographic process and third photolithographic process can be integrated into the same single photolithographic process. In terms of more detailed description, half tone mask or gray tone mask, for example, can be used to fabricate etching mask with various thickness for etching with different depths to form the first opening 132, the second opening 134 and the patterned semiconductor layer 140.

Figure 1D:
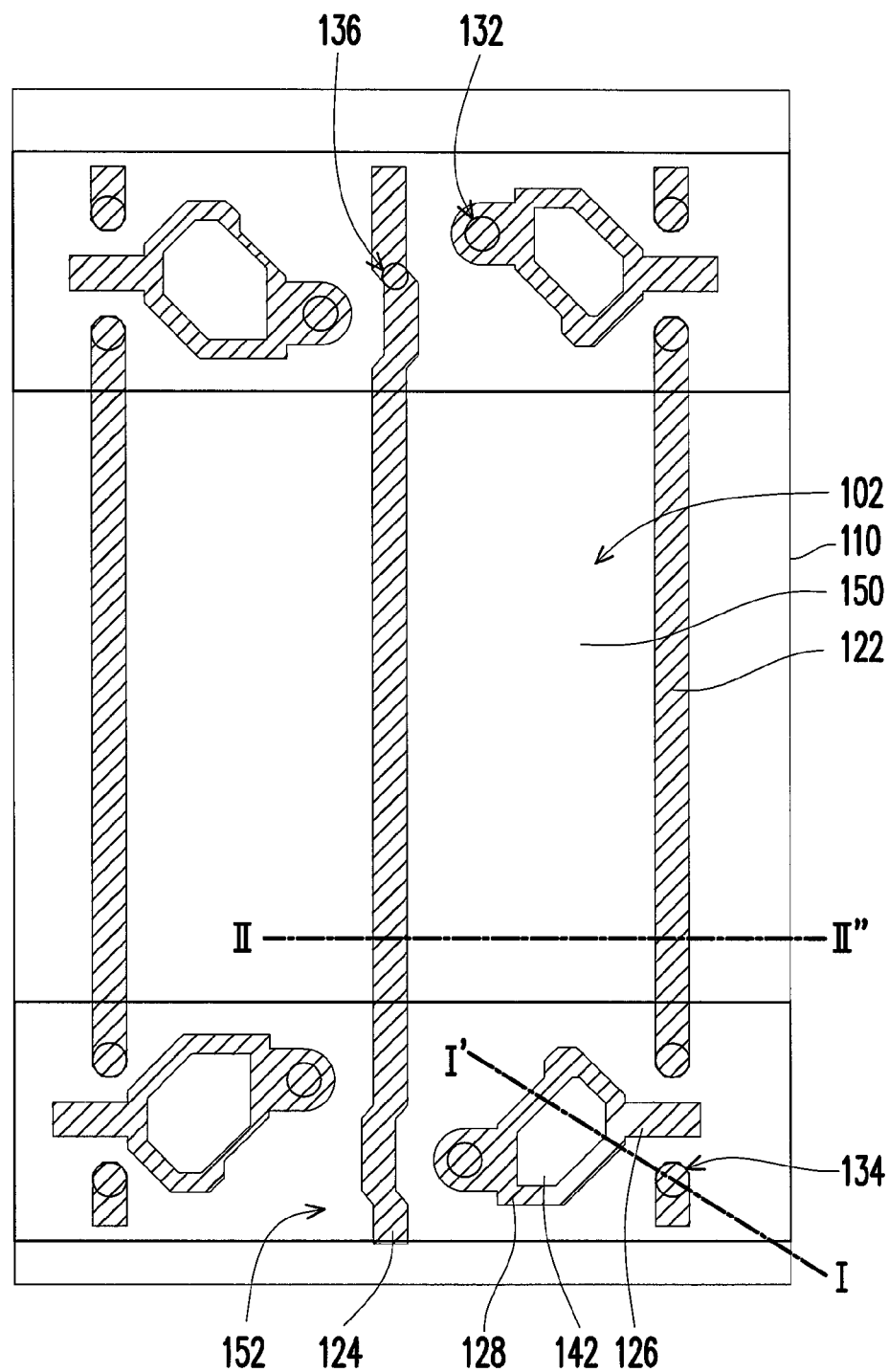
Figure 2D:
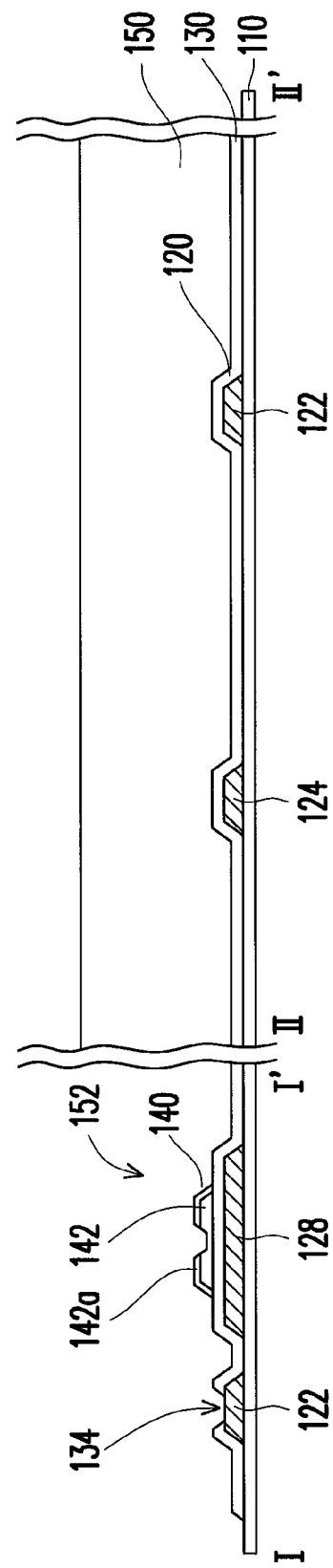

After the above mentioned steps, as shown in FIG. 1D and FIG. 2D, a fourth photolithographic process is done to form a patterned planarization layer 150 on the gate insulating layer 130. The patterned planarization layer 150 has a plurality of slots 152 The plurality of slots expose the quasi-scan lines 126, the gates 128, the channel patterns 142, the first openings 132 and the second openings 134 respectively. And the slots 152 extend along the quasi-scan lines 126.

Furthermore, the order of the above third photolithographic process and the fourth photolithographic process can be exchanged. In other words, it can be chosen in this embodiment that either before forming the patterned semiconductor layer 140, the first openings 132 and the second openings 134 are formed, or after forming the patterned semiconductor layer 140, the first openings 132 and the second openings 134 are formed on the gate insulating layer 130 which is exposed by the slots 152.

Figure 1E:
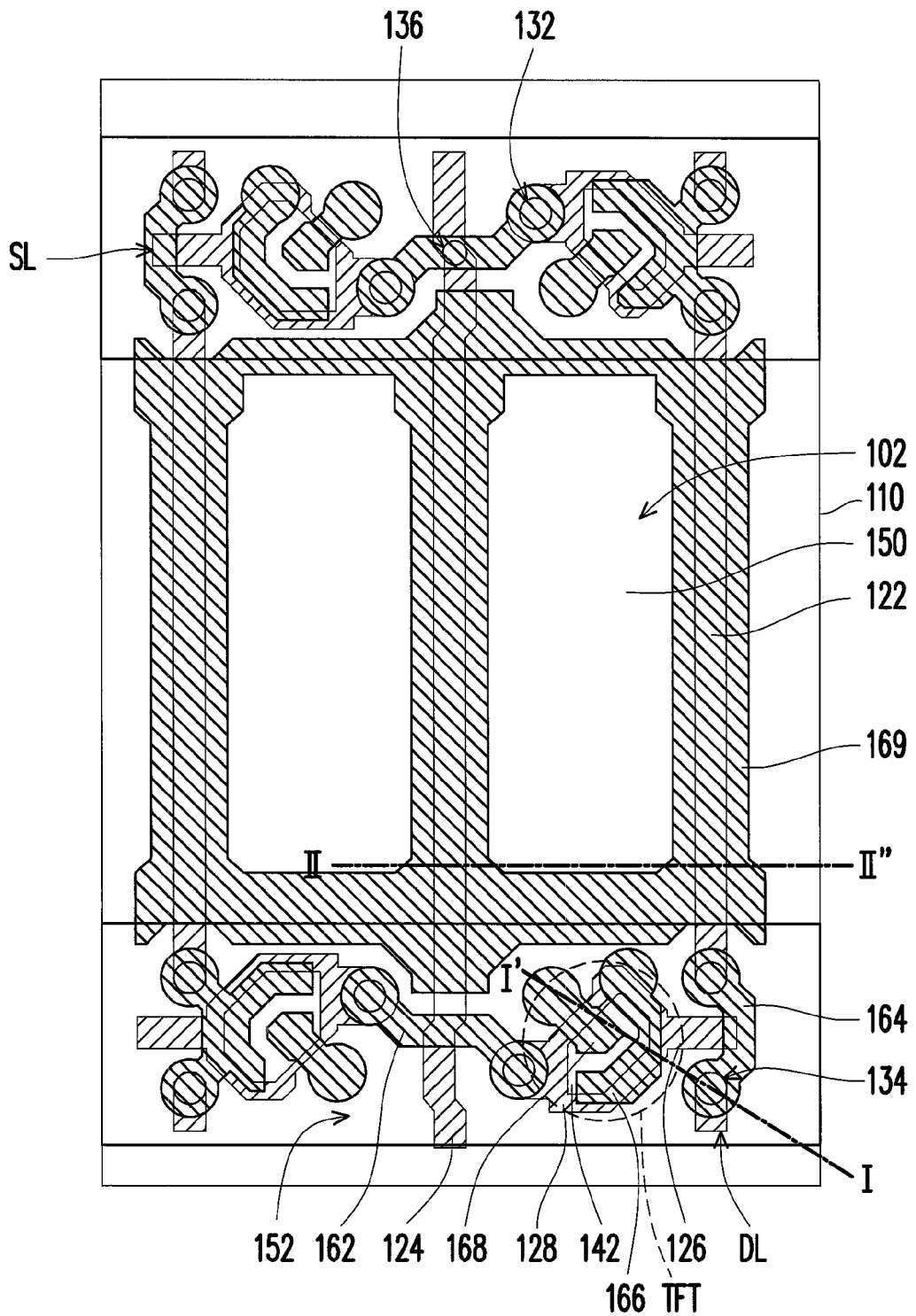
Figure 2E:
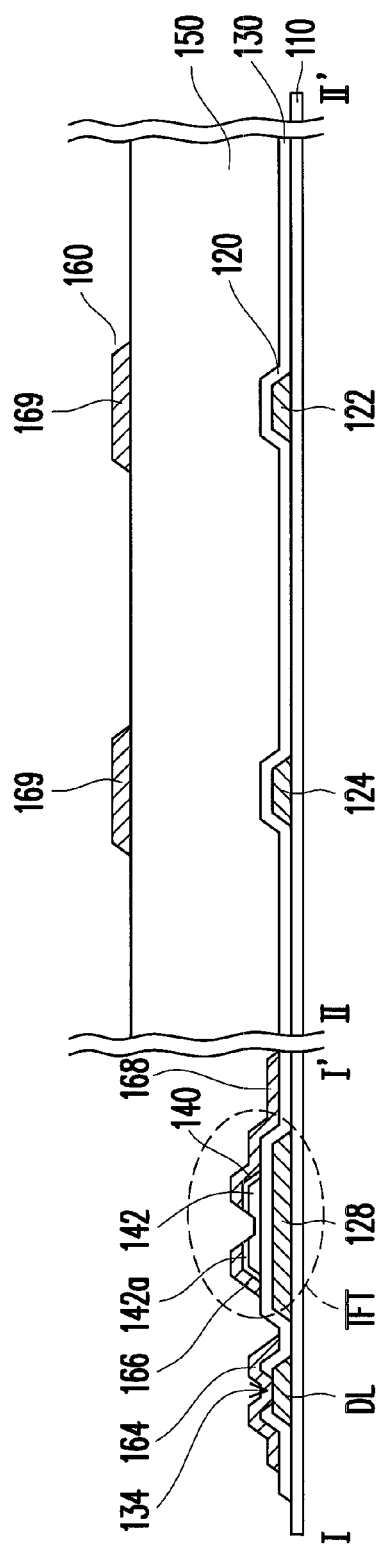

Then, as shown in FIG. 1E and FIG. 2E, a fifth photolithographic process is done to form a patterned second metal layer 160. The patterned second metal layer 160 comprises a plurality of first connecting patterns 162, a plurality of second connecting patterns 164, a plurality of sources 166, a plurality of drains 168 and a plurality of common electrodes 169. The first connecting patterns 162 are configured on the gate insulating layer 130 and located in the corresponding slots 152 to cascade-connect the quasi-scan lines 126. The first connecting patterns 162 are connected to the quasi-scan lines 126 respectively through the corresponding first openings 132 to form a plurality of scan lines SL. The second connecting patterns 164 are configured on the gate insulating layer 130 and located in the corresponding slots 152 to cascade-connect the quasi-data lines 122. The second connecting patterns 164 are connected to the quasi-data lines 122 respectively through the corresponding second openings 134 to form a plurality of data lines DL. The sources 166 and the drains 168 are configured on the channel patterns 142 and located in the corresponding slots 152. Each of the sources 166 and its corresponding drain 168 are located on the opposite sides of the corresponding gate 128, and each of the sources 166 is electrically connected to the corresponding data line DL. Thin film transistor (TFT) is formed by each of the gates 128 and its corresponding source 166, drain 168 and channel pattern 142. Moreover, the common electrodes 169 are configured on the patterned planarization layer 150 and surrounding the corresponding pixel regions 102 respectively.

Figure 1F:
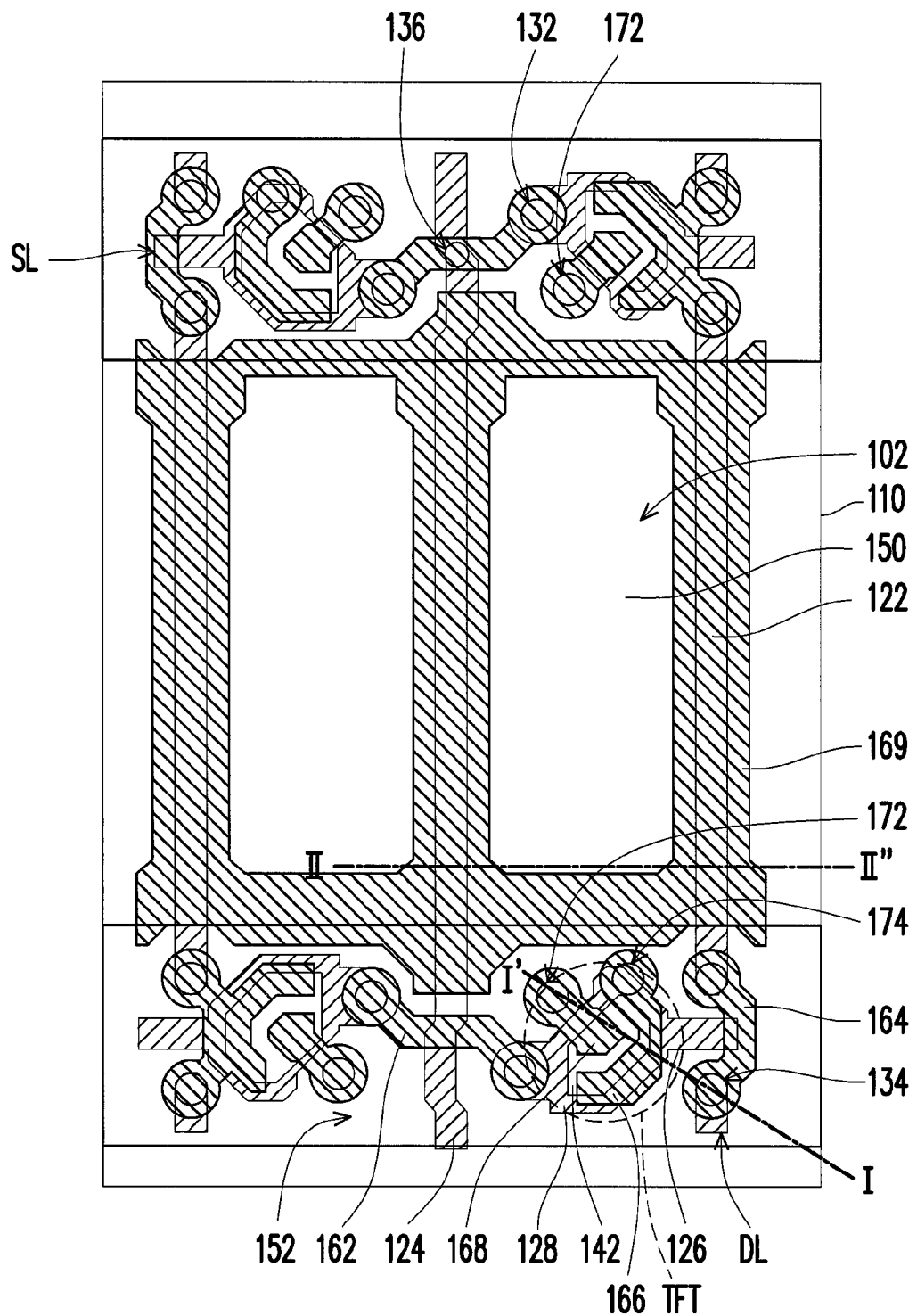
Figure 2F:
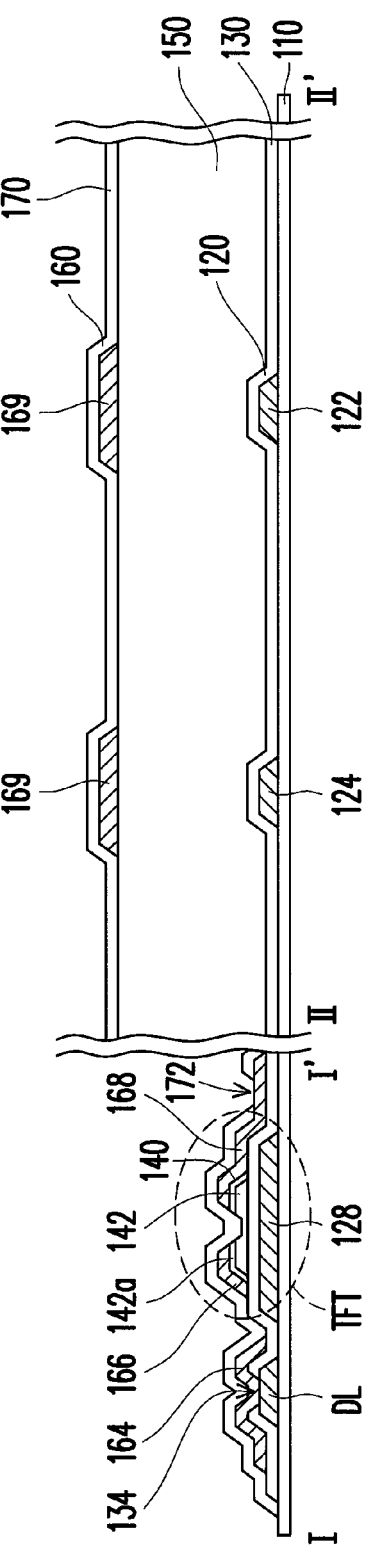

Hereafter, as shown in FIG. 1F and FIG. 2F, a protective layer 170 is formed for covering the gate insulating layer 130, the patterned second metal layer 160, the patterned planarization layer 150 and the channel patterns 142. And a sixth photolithographic process is done to form a plurality of third openings 172 within the protective layer 170 for exposing a portion of each of the drains 168.

Figure 1G:
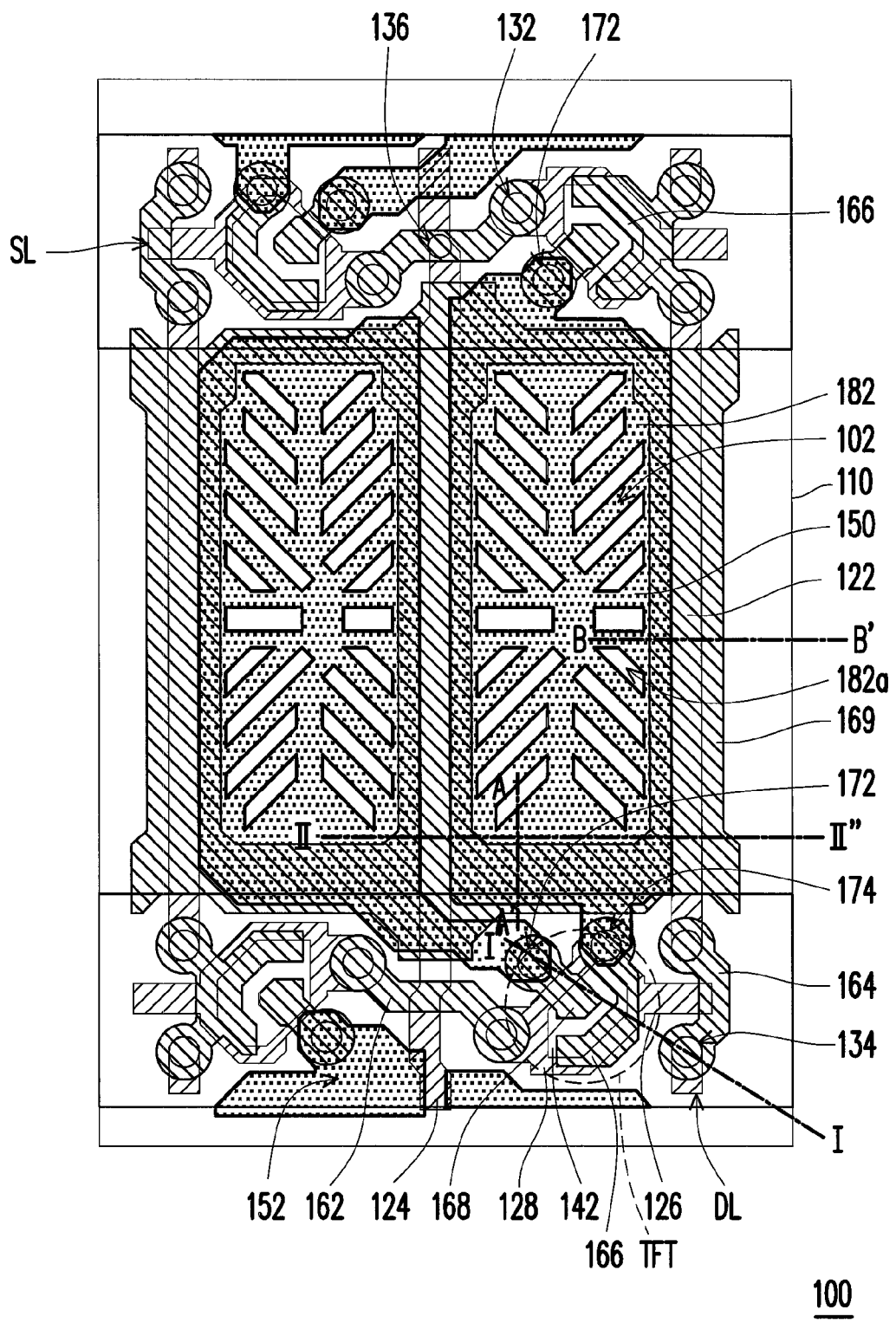
Figure 2G:
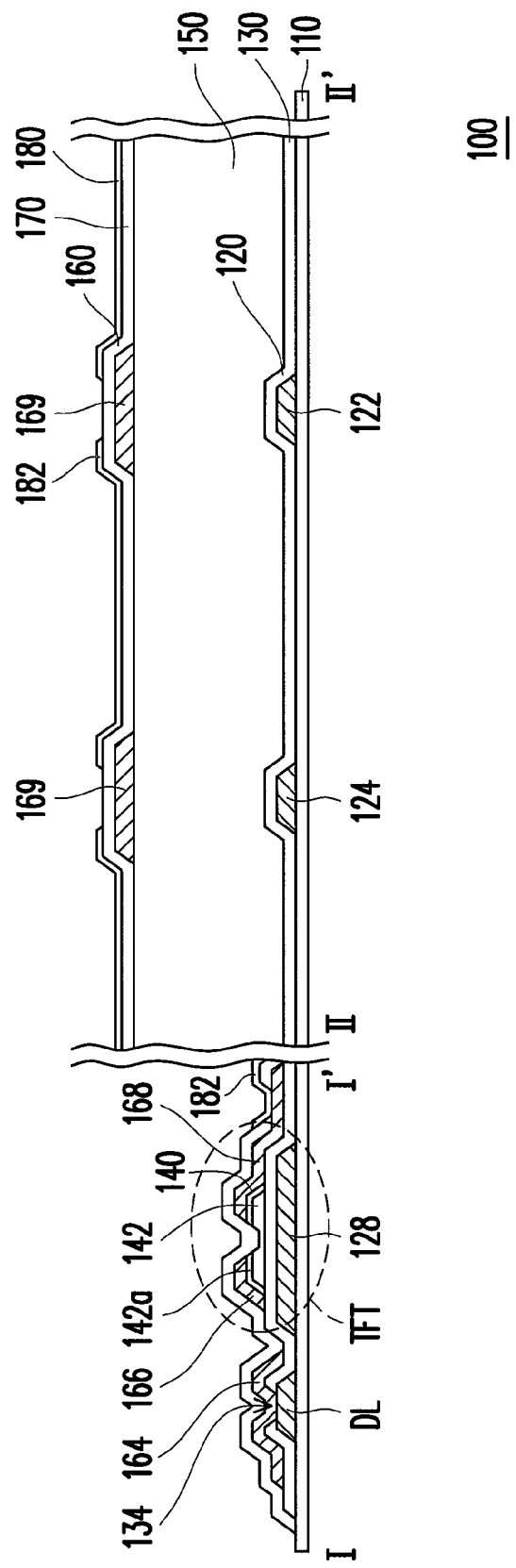

And then, as shown in FIG. 1G and FIG. 2G, a seventh photolithographic process is done to form a patterned transparent electrode layer 180 on the protective layer 170. The patterned transparent electrode layer 180 comprises a plurality of pixel electrodes 182 which are located in the corresponding pixel regions 102. Each of the pixel electrodes 182 is electrically connected to the corresponding drain 168 through the corresponding third opening 172. The pixel electrodes 182 of this embodiment can have a plurality of slits 182a. Furthermore, in the embodiment, the pixel electrode 182 is connected to the source 166 of the corresponding adjacent thin film transistor through another opening 174 within the protective layer 170. It means that the pixel electrode 182 on the right side can be connected to the corresponding adjacent thin film transistor through another opening 174 and again electrically connected to the pixel electrode 182 on the left side to accomplish the driving of two pixel electrodes sharing one data line DL.

The manufacturing of the thin film transistor array substrate process is substantially finished at this point.

Merely seven photolithographic processes, or six processes if the second photolithographic process and the third photolithographic process are integrated into one photolithographic process, are required in the above mentioned manufacturing method of the thin film transistor array substrate 100. Thus, the method has the advantages of streamlined process and high production efficiency. Furthermore, the structure of the thin film transistor array substrate 100 is much simpler than that of prior art in design. Unlike prior art, an extra third patterned metal layer is not required to form common electrodes in present invention. The thin film transistor array substrate 100 has only two patterned metal layers, 120 and 160. It can significantly reduce the complexity of the structure and benefit the process design.

On the other hand, in the thin film transistor array substrate 100 shown in FIG. 1G and FIG. 2G, the patterned planarization layer 150 is located on the patterned first metal layer 120 while the patterned second metal layer 160 is located on the patterned planarization layer 150. In other words, since the patterned planarization layer 150 has a larger thickness than the other dielectric layer like the gate insulating layer 130 or the protective layer 170, the distance between the patterned first metal layer 120 and the patterned second metal layer 160 can be spread out. In general, the thickness of patterned planarization layer can be up to 2-3 μm. Accordingly, the parasitic capacitance between the common electrode 169 and the patterned first metal layer 120 can be reduced and thus the power loading can be decreased.

In addition, as shown in FIG. 1G and FIG. 2G, since the patterned planarization layer 150 has a plurality of slots 152, the distance between the scan line SL and the common electrode 169 can be relatively spread out through the height difference caused by the slots 152. Similarly, it can help to reduce the parasitic capacitance and the resulting power loading. Moreover in the above mentioned embodiment, in order to obtain the maximum reduction of the power loading, the scan line SL can be disposed in the center of the corresponding slot 152 to be distant from the common electrodes 169 on both sides.

Furthermore, in the thin film transistor array substrate 100, the scan signal transmission line 124 is disposed parallel to the data line DL for transmitting scan signal to the corresponding scan line SL. Since the scan signal transmission line 124 and the data line DL are in the same direction, the signal input source (e.g., the driving IC) of the scan signal and the data signal can be disposed on the same side of the substrate 110 for benefiting the narrow frame design of LCD panels.

Any possible way of electrically connecting each of the scan signal transmission line 124 to the corresponding scan line SL can be utilized in the above mentioned thin film transistor array substrate 100. For instance, as shown in FIG. 1C, in the third photolithographic process, besides forming the first opening 132 and the second opening 134, a plurality of fourth opening 136 can also formed within the gate insulating layer 130 for exposing a portion of the corresponding scan signal transmission line 124. In this way, in the follow-up fifth photolithographic process of forming the patterned second metal layer 160, the first connecting pattern 162 can be connected downwardly to the scan signal transmission line 124 through the corresponding fourth opening 136.

Additionally, the other way of electrically connecting the scan signal transmission line 124 to the corresponding scan line SL can be used in present invention. As shown in FIG. 1A', in the first photolithographic process, changes to the photomask pattern can be made so that the patterned first metal layer 120 further comprises a plurality of third connecting patterns 129. Accordingly, each of the scan signal transmission line 124 can be directly connected to the corresponding quasi-scan line 126 through the third connecting pattern 129.

Figure 3:
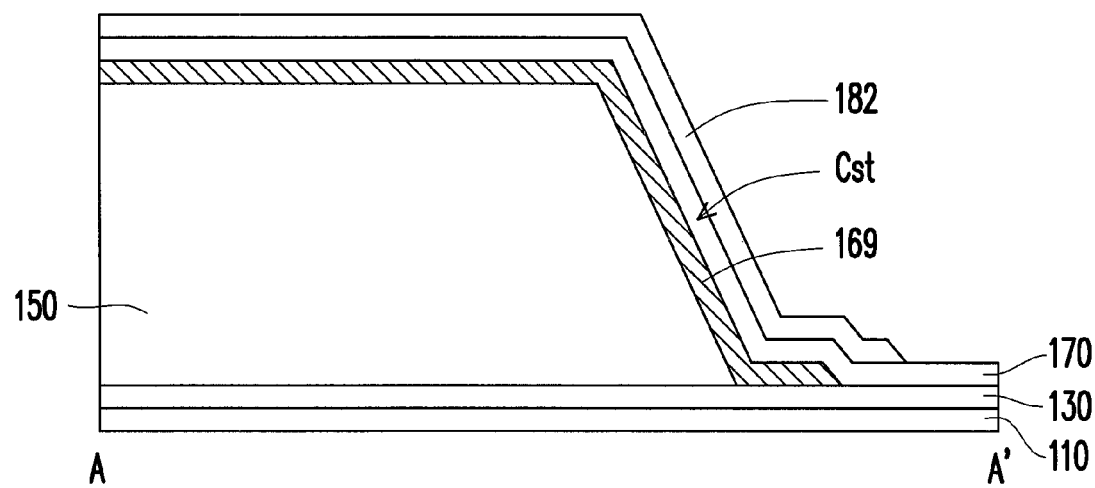
FIG. 3 illustrates the cross section structure of the thin film transistor array substrate along the line A-A' of FIG. 1G.

FIG. 3 illustrates the cross section structure of the thin film transistor array substrate along the line A-A' of FIG. 1G. As illustrated in FIG. 3, a storage capacitance Cst is formed between the common electrode 169 and the corresponding pixel electrode 182. It can be seen in the cross section view of A-A', since the patterned planarization layer 150 has slots 152, the overlapping area between the common electrode 169 and the pixel electrode 182 is enlarged because of the incline of the patterned planarization layer 150. In other words, the storage capacitance Cst is significantly increased because of the slot 152 of the patterned planarization layer 150.

Figure 4A:
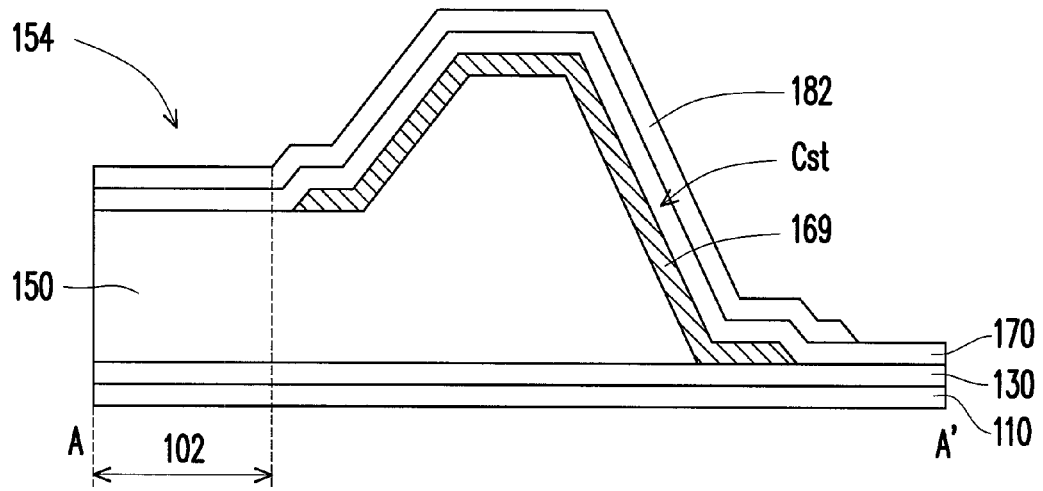
FIGS. 4A and 4B illustrate the cross section structure of the thin film transistor array substrate along the line A-A' and B-B' of FIG. 1G respectively.
Figure 4B:
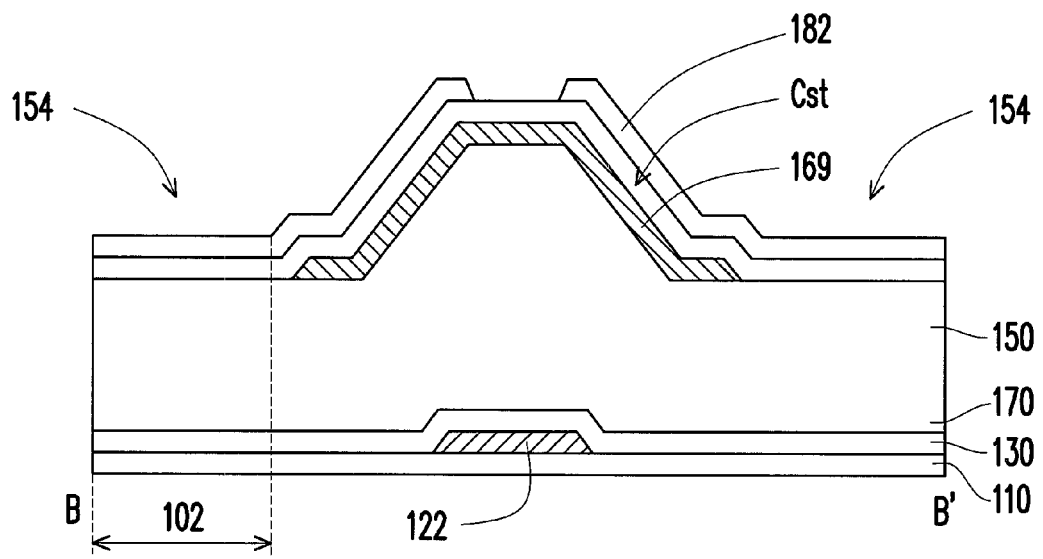

Furthermore, the overlapping area between the common electrode 169 and the pixel electrode 182 can be further improved by using other ways in present invention. FIGS. 4A and 4B illustrate the cross section structure of the thin film transistor array substrate along the line A-A' and B-B' of FIG. 1G respectively. As shown in FIG. 4A and FIG. 4B, a plurality of recesses 154 can be formed on the places of the patterned planarization layer 150 corresponding to the pixel regions 102, and the recesses 154 are being covered by the pixel electrodes 182 respectively. Similarly, the overlapping area between the common electrode 169 and the pixel electrode 182 can be enlarged through the side wall of the recess 154 and the storage capacitance Cst can be further improved. The above mentioned recess 154 and slot 152 can be formed either by the same fourth photolithographic process or the recess 154 can be formed by another extra photolithographic process.

Though the manufacturing method of a thin film transistor array substrate 100 has been illustrated with the above mentioned embodiment together with FIGS. 1A-1G and FIGS. 2A-2G which are showing the process, people skilled in the art can make adjustments, variations and replacement to the process steps according to the actual demand and current level of technology. In other words, the manufacturing method of a thin film transistor array substrate 100 is not limited to the illustration of FIGS. 1A-1G and FIGS. 2A-2G. Moreover, the process steps illustrated in FIGS. 1A-1G and FIGS. 2A-2G can be changed in order to obtain finished products or semi finished products which are different to the thin film transistor array substrate 100. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor array substrate, comprising:
   a substrate;
   a plurality of data lines, disposed on the substrate;
   a plurality of scan signal transmission lines, disposed in parallel to each other with the data lines on the substrate, with one scan signal transmission line disposed between every two adjacent data lines;
   a plurality of scan lines, disposed on the substrate and intersecting the data lines and the scan signal transmission lines, so as to define a plurality of pixel regions on the substrate;
   a plurality of thin film transistors, disposed on the substrate, each electrically connected to the corresponding scan line and the corresponding data line;
   a patterned planarization layer, configured on the substrate, wherein the patterned planarization layer has a plurality of slots, completely exposing the scan lines and the thin film transistors and extending along the scan lines;
   a plurality of common electrodes, configured on the patterned planarization layer and surrounding the corresponding pixel regions respectively;
   a protective layer, covering the data lines, the scan signal transmission lines, the scan lines, the thin film transistors, the patterned planarization layer and the common electrodes, the protective layer having a plurality of openings for exposing a portion of a drain of each of the thin film transistors;
   a plurality of pixel electrodes, configured on the protective layer and placed in the corresponding pixel regions, the pixel electrodes electrically connected to the drains through the openings.

2. The thin film transistor array substrate according to claim 1, wherein the patterned planarization layer further comprises a plurality of recesses corresponding to the pixel regions, and the pixel electrodes cover the recesses.

3. The thin film transistor array substrate according to claim 1, wherein each of the scan lines is located in the center of the corresponding slot.

4. The thin film transistor array substrate according to claim 1, wherein each of the scan signal transmission lines is electrically connected to the corresponding one of the scan lines.

5. A thin film transistor array substrate, comprising:
   a substrate;
   a patterned first metal layer, comprising:
      a plurality of quasi-data lines, disposed on the substrate;
      a plurality of scan signal transmission lines, disposed in parallel to each other with the quasi-data lines on the substrate, with one scan signal transmission line disposed between every two adjacent quasi-data lines;
      a plurality of quasi-scan lines, disposed on the substrate, wherein the quasi-scan lines, the quasi-data lines and the scan signal transmission lines define a plurality of pixel regions on the substrate;
      a plurality of gates, configured on the substrate and connected to the quasi-scan lines;
   a gate insulating layer, configured on the substrate and covering the patterned first metal layer, wherein the gate insulating layer includes a plurality of first openings and a plurality of second openings, the first openings expose a portion of each of the quasi-scan lines respectively, and the second openings expose a portion of each of the quasi-data lines respectively;
   a patterned semiconductor layer, configured on the gate insulating layer, wherein the patterned semiconductor layer comprises a plurality of channel patterns located above the corresponding gate respectively;
   a patterned planarization layer, configured on the gate insulating layer, wherein the patterned planarization layer has a plurality of slots, exposing the quasi-scan lines, the gates, the channel patterns, the first openings and the second openings, and extending along the quasi-scan lines;
   a patterned second metal layer, comprising:
      a plurality of first connecting patterns, configured on the gate insulating layer and located in the corresponding slots, the first connecting patterns connected to the quasi-scan lines via the corresponding first openings respectively to form a plurality of scan lines;
      a plurality of second connecting patterns, configured on the gate insulating layer and located in the corresponding slots, the second connecting patterns connected to the quasi-data lines respectively via the corresponding second openings to form a plurality of data lines;
      a plurality of sources and a plurality of drains, configured on the channel patterns and located in the corresponding slots, each of the sources and its corresponding drain located on the opposite sides of the corresponding gate, and each of the sources electrically connected to the corresponding data line;
   a plurality of common electrodes, configured on the patterned planarization layer and surrounding the corresponding pixel regions respectively;
   a protective layer, covering the gate insulating layer, the patterned second metal layer, the patterned planarization layer and the channel patterns, the protective layer having a plurality of third openings for exposing a portion of each of the drains; and a patterned transparent electrode layer, configured on the protective layer, wherein the patterned transparent electrode layer comprises a plurality of pixel electrodes located in the pixel regions, and the pixel electrodes are electrically connected to the drains through the third openings.

6. The thin film transistor array substrate according to claim 5, wherein the patterned planarization layer further comprises a plurality of recesses corresponding to the pixel regions, and the pixel electrodes cover the recesses.

7. The thin film transistor array substrate according to claim 5, wherein each of the scan lines is located in the center of the corresponding slot.

8. The thin film transistor array substrate according to claim 5, wherein each of the scan signal transmission lines is electrically connected to the corresponding one of the scan lines.

9. The thin film transistor array substrate according to claim 8, wherein the gate insulating layer further comprises a plurality of fourth openings exposing a portion of each of the scan signal transmission lines, and the first connecting patterns are connected to the scan signal transmission lines through the corresponding fourth openings so that each of the scan signal transmission lines is electrically connected to the corresponding one of the scan lines.

10. The thin film transistor array substrate according to claim 8, wherein the patterned first metal layer further comprises a plurality of third connecting patterns, and each of the third connecting patterns is connected between the corresponding scan signal transmission line and the corresponding scan line.

11. A manufacturing method of a thin film transistor array substrate, comprising:

providing a substrate;

forming a patterned first metal layer on the substrate, and the patterned first metal layer comprising:
- a plurality of quasi-data lines;
- a plurality of scan signal transmission lines, parallel to each other with the quasi-data lines, with one scan signal transmission line disposed between every two adjacent quasi-data lines;
- a plurality of quasi-scan lines, wherein the quasi-scan lines, the quasi-data lines and the scan signal transmission lines define a plurality of pixel regions on the substrate;
- a plurality of gates, connected to the quasi-scan lines;

forming a gate insulating layer on the substrate, the gate insulating layer covering the patterned first metal layer;

forming a patterned semiconductor layer on the gate insulating layer, wherein the patterned semiconductor layer comprises a plurality of channel patterns located above the corresponding gate respectively;

forming a plurality of first openings and a plurality of second openings within the gate insulating layer, the first openings exposing a portion of each of the quasi-scan lines respectively and the second openings exposing a portion of each of the quasi-data lines respectively;

forming a patterned planarization layer on the gate insulating layer, wherein the patterned planarization layer has a plurality of slots, exposing the quasi-scan lines, the gates, the channel patterns, the first openings and the second openings, and extending along the quasi-scan lines;

forming a patterned second metal layer, the patterned second metal layer comprising:
- a plurality of first connecting patterns, configured on the gate insulating layer and located in the corresponding slots, the first connecting patterns connected to the quasi-scan lines respectively via the corresponding first openings to form a plurality of scan lines;
- a plurality of second connecting patterns, configured on the gate insulating layer and located in the corresponding slots, the second connecting patterns connected to the quasi-data lines respectively via the corresponding second openings to form a plurality of data lines;
- a plurality of sources and a plurality of drains, configured on the channel patterns and located in the corresponding slots, each of the sources and its corresponding drain located on the opposite sides of the corresponding gate, and each of the sources electrically connected to the corresponding data line;
- a plurality of common electrodes, configured on the patterned planarization layer and surrounding the corresponding pixel regions respectively;

forming a protective layer for covering the gate insulating layer, the patterned second metal layer, the patterned planarization layer and the channel patterns;

forming a plurality of third openings within the protective layer for exposing a portion of each of the drains; and forming a patterned transparent electrode layer on the protective layer, wherein the patterned transparent electrode layer comprises a plurality of pixel electrodes located in the pixel regions, and the pixel electrodes are electrically connected to the drains through the third openings.

12. The manufacturing method of a thin film transistor array substrate according to claim 11, further comprising forming a plurality of recesses on the patterned planarization layer corresponding to the pixel regions, wherein the pixel electrodes cover the recesses.

13. The manufacturing method of a thin film transistor array substrate according to claim 11, wherein the recesses and the slots are formed in one single photolithographic process.

14. The manufacturing method of a thin film transistor array substrate according to claim 11, wherein the first openings, the second openings and the channel patterns are formed in one single photolithographic process.

15. The manufacturing method of a thin film transistor array substrate according to claim 11, wherein the first openings and the second openings are formed before forming the patterned planarization layer.

16. The manufacturing method of a thin film transistor array substrate according to claim 11, wherein the first openings and the second openings are formed after forming the patterned planarization layer.

17. The manufacturing method of a thin film transistor array substrate according to claim 11, further comprising electrically connecting each of the scan signal transmission lines to the corresponding one of the scan lines.

18. The manufacturing method of a thin film transistor array substrate according to claim 11, further comprising forming a plurality of fourth openings within the gate insulating layer for exposing a portion of each of the scan signal transmission lines, so that the first connecting patterns are connected to the scan signal transmission lines through the corresponding fourth openings and each of the scan signal transmission lines is electrically connected to the corresponding one of the scan lines.

19. The manufacturing method of a thin film transistor array substrate according to claim 11, wherein the patterned first metal layer further comprises a plurality of third connecting patterns, and each of the third connecting patterns is connected between the corresponding scan signal transmission line and the scan line.

* * * * *